United States Patent [19]
Hughes et al.

[11] Patent Number: 4,820,657
[45] Date of Patent: Apr. 11, 1989

[54] METHOD FOR ALTERING CHARACTERISTICS OF JUNCTION SEMICONDUCTOR DEVICES

[75] Inventors: David W. Hughes, Chamblee; Robert K. Feeney, Doraville, both of Ga.

[73] Assignee: Georgia Tech Research Corporation, Atlanta, Ga.

[21] Appl. No.: 53,475

[22] Filed: May 26, 1987

Related U.S. Application Data

[63] Continuation-in-part of Ser. No. 11,611, Feb. 6, 1987, abandoned.

[51] Int. Cl.$^4$ .......................................... H01L 21/326
[52] U.S. Cl. ...................................... 437/172; 437/957
[58] Field of Search ................... 437/8, 170, 172, 173, 437/957, 142, 143

[56] References Cited

U.S. PATENT DOCUMENTS

| | | | |
|---|---|---|---|
| 2,875,506 | 3/1959 | Swanson et al. | 437/172 |
| 2,916,408 | 12/1959 | Freedman | 437/7 |
| 3,333,326 | 8/1967 | Thomas, Jr. et al. | 437/7 |
| 3,355,334 | 11/1967 | Dhaka et al. | 437/957 X |
| 3,576,549 | 4/1971 | Hess et al. | 437/172 X |
| 4,534,100 | 8/1985 | Lane | 437/141 |
| 4,606,781 | 8/1986 | Vyne | 437/8 |
| 4,646,427 | 3/1987 | Doyle | 357/13 X |

FOREIGN PATENT DOCUMENTS

| | | | |
|---|---|---|---|
| 0144878 | 11/1979 | Japan | 437/172 |
| 0008820 | 3/1980 | Japan | 437/170 |
| 0022337 | 2/1984 | Japan | 437/172 |
| 0046418 | 11/1984 | Japan | 437/172 |

*Primary Examiner*—Olik Chaudhuri
*Attorney, Agent, or Firm*—Michael B. Einschlag

[57] ABSTRACT

Method for altering an electrical characteristic of a circuit having at least one junction formed from a first and a second semiconductor material involves applying at least one pulse --a voltage pulse, a current pulse, an energy pulse, or a power pulse and so forth-- across the junction, the pulse having sufficient amplitude of one or more of its electrical parameters and time duration to alter the electrical characteristics of the junction, and thereby, the electrical characteristic of the circuit. The pulse is applied across the junction by applying it to at least one terminal or electrode which is contacted to the first or second semiconductor material. In addition, the amplitudes of the electrical parameters and time duration of the at least one pulse should be low enough to ensure that dendrites or filaments of material from the at least one electrode, for example, metal, are not formed in the first or second semiconductor material.

13 Claims, 2 Drawing Sheets

METHOD FOR ALTERING CHARACTERISTICS OF JUNCTION SEMICONDUCTOR DEVICES

BACKGROUND OF THE INVENTION

This is a continuation-in-part of application Ser. No. 011,611, filed Feb. 6, 1987 now abandoned.

This invention relates to a method for altering the electrical characteristics of circuits and, in particular, to a method for altering the electrical characteristics of circuits which comprise at least one semiconductor device having at least one junction.

The silicon integrated circuit industry has long recognized the need to develop methods to mitigate the effects of processing variations in order to obtain satisfactory yields of high performance integrated circuit chips and/or discrete components. As a consequence of processing variations, either the design requirements for the operating parameters of the resulting chips and/or discrete components are not met or, in extreme cases, the resulting chips and/or discrete components do not function at all. Thus, the yield of the chips and/or components is low and the manufacturing cost is high. In addition, yields tend to decrease markedly as a result of processing variations as an integrated circuit becomes more complex. As a consequence, a large scale integrated circuit, particularly one fabricated from a compound semiconductor, may have a trivial yield in practice.

One commonly used method for altering circuit parameters to mitigate the effects of processing variations, such methods being generally referred to in the art as "trimming" or "tweaking," is the so-called "zener zapping" method. This, and similar methods known in the art, involve patching elements into or out of the active circuitry by creating either shorts or open circuits. In such methods, lasers and electrically fusible links are commonly used to achieve the requisite shorts or opens. Such tweaking methods for altering circuits are particularly important for use in manufacturing analog circuits because these circuits typically have stringent requirements placed on their parametric quantities.

Tweaking is also necessary with hybrid circuits. In this case, tweaking is frequently done by substitution of components, mechanical manipulation of trimming tabs or adjustment of external power supplies. Unfortunately, these methods cannot easily be applied to integrated circuits made from silicon, gallium arsenide or other semiconductors.

Regardless of the details, conventional trimming techniques have disadvantages. For example, the necessity to design-in the capability to trim the circuitry of interest produces complex trimming circuits as more demanding chips and/or highly variable manufacturing processes are developed. Hence, conventional trimming methods inflate the component count and, therefore, the chip size in an attempt to tweak out the inevitable results of process variation.

SUMMARY OF THE INVENTION

Embodiments of the present invention solve the above-identified problems with known methods for altering the electrical characteristics of a circuit without: (1) necessarily utilizing extraneous circuit elements, (2) destroying existing circuit elements, or (3) bypassing existing circuit elements. In fact, embodiments of the present invention provide a method for directly altering the electrical parameters or characteristics of a circuit which comprises at least one semiconductor device having at least one junction.

A first embodiment of the inventive method for altering an electrical characteristic of a circuit having at least one junction formed from a first and a second semiconductor material comprises applying at least one pulse—a voltage pulse, a current pulse, an energy pulse, or a power pulse and so forth—across the junction, the pulse having sufficient amplitude of one or more of its electrical parameters and time duration to alter the electrical characteristics of the junction and, thereby, the electrical characteristics of the circuit. The pulse is applied across the junction by applying it to at least one terminal or electrode which is contacted to the first or second semiconductor material. In addition, the amplitudes of the electrical parameters and the time duration of the at least one pulse should be low enough to ensure that dendrites or filaments of material from the electrode, for example, metal, are not formed in the first or second semiconductor material.

The term "voltage pulse" is used to define an electrical pulse whose voltage characteristic is predetermined, the term "current pulse" is used to define an electrical pulse whose current characteristic is predetermined, the term "energy pulse" is used to define an electrical pulse whose energy characteristic is predetermined, the term "power pulse" is used to define an electrical pulse whose power characteristic is predetermined, and so forth. The term "amplitude of one of its electrical parameters" is used to define a voltage amplitude, a current amplitude, an energy amplitude, or a power amplitude, and so forth. Further, the term "amplitude of one or more of its electrical parameters" is used to define one or more of the following: a voltage amplitude, a current amplitude, an energy amplitude, or a power amplitude, and so forth. In addition, in order to achieve the required alteration of the electrical characteristics of the junction in accordance with the inventive method, the pulses will typically have an amplitude of one or more of its electrical parameters, whether it be voltage or current or power and so forth, which substantially exceeds the amplitude of the normal operating condition of the corresponding electrical parameters for the junction. Further in addition, the term "electrical pulse" is used to define an electrical signal which commences at a first point in time and ends at a second point in time. Typically, but not necessarily, the time duration between the first and second points in time is not long.

The circuit whose characteristics are altered in accordance with the present invention may be a discrete component, an integrated circuit containing many semiconductor devices, or a circuit comprising many integrated circuits. Thus, in manufacturing a complex circuit it may be necessary to use embodiments of the inventive method to alter several junctions contained at various points and in various components in the circuit to achieve a desired adjustment of particular electrical characteristics of the circuit as a whole.

Further embodiments of the inventive method involve measuring a predetermined electrical characteristic of a circuit, applying an alteration pulse to at least one junction of the circuit, and then repeatedly applying the pulse or other pulses having a variable amplitude of one or more of its electrical parameters and time duration and measuring the electrical characteristic until the difference between the measured value and a predetermined value of the electrical characteristic is within a predetermined amount.

A preferred embodiment of the inventive method involves applying at least one short duration pulse in reverse bias direction across terminals or electrodes of a semiconductor circuit which are contacted to semiconductor material disposed on opposite sides of a junction, the amplitude of the voltage of the pulse being sufficient to overcome the breakdown voltage between the terminals and the time duration of the pulse being sufficient to alter the electrical characteristics of the junction and, thereby, the circuit. The amplitudes of the electrical parameters and the duration of the pulse are small enough so that dendrites or filaments of material from the electrodes, for example, metal, are not formed in the semiconductor material on either side of the junction. This preferred embodiment may be used, for example, to alter the emitter-base leakage current of a discrete component such as an NPN transistor by subjecting the emitter-base junction to a reverse bias voltage having an amplitude which is sufficient to overcome the breakdown voltage of that junction, the voltage being applied for a length of time which is sufficient to effect the desired alteration but not long enough to form dendrites or filaments in the semiconductor material on either side of the junction. Similarly, a pulse may be applied in reverse bias direction across the base and collector terminals of the discrete transistor component to alter its electrical characteristics.

In further embodiments of the inventive method, at least one current pulse or voltage pulse is applied in the forward bias direction across at least one terminal or electrode of a circuit which is contacted to semiconductor material disposed on one side of a junction, the amplitudes of the electrical parameters and the time duration of the at least one pulse being sufficient to alter the electrical characteristics of the junction without forming dendrites or filaments of material from the at least one terminal or electrode, for example, metal, in the semiconductor material on either side of the junction.

It is believed that embodiments of the inventive method alter an electrical characteristic of a circuit by modifying the electrical characteristics of a junction contained within the circuit. The electrical characteristics of the junction are modified by introducing material, for example, metallic ions or atoms, from at least one terminal or electrode contacted to semiconductor material disposed on either side of the junction into the vicinity of the junction. It is for this reason that the inventive method requires the pulses, whether they be current pulses or voltage pulses and the like, to have insufficient amplitudes of their electrical parameters and time duration to cause dendrites or filaments to be formed in the semiconductor material disposed on either side of the junction.

As discussed above, embodiments of the inventive method may be used to trim or alter an electrical characteristic of (1) a discrete component such as a bipolar transistor, or (2) a semiconductor component which is associated with other semiconductor components in a composite circuit. In the later case, the electrical characteristics of at least one junction in the composite circuit is altered. This occurs in such a fashion that it, in turn, affects the electrical response of the composite circuit, i.e., the junction is trimmed so that, as a consequence, the composite circuit is trimmed. A first example of such a composite circuit which is altered in accordance with the present invention is a current mirror and, in the detailed description which follows, a specific current mirror is described in conjunction with the alteration effected therein by an embodiment of the inventive method. A second example of such a composite circuit which is altered in accordance with the present invention is a differential amplifier and, in the detailed description which follows, a specific differential amplifier is described in conjunction with the alteration effected therein by an embodiment of the inventive method.

Alternative embodiments of the inventive method include those embodiments for use when the precise effect of a particular pulse in altering a particular electrical characteristic of a circuit is not known in advance of its application. In such embodiments, a pulse or a series of pulses is applied to the terminals contacted to either side of a junction. After each pulse or packet of pulses is applied, the particular electrical characteristic is measured to determine whether the predetermined value of the electrical characteristic has been achieved. Further pulses are applied until the measurement indicates that the predetermined value has been achieved and that further alteration by applying further pulses is not required. Thus, such embodiments provide a method of achieving the desired result when, as will be true in general, the precise degree to which the alteration pulses required is not known a priori. Nevertheless, it has been found in practice that semiconductor chips of the same type and provided by the same manufacturer, display substantially the same electrical characteristics. Thus, after one has empirically arrived at the required pulse characteristics, i.e., amplitude, duration and number, required to achieve a predetermined result for one of these chips, it may subsequently be repeated on other like integrated circuit chips with substantially the same results.

The inventive method may be used with discrete components and/or integrated circuits fabricated from a variety of semiconductor materials including without limitation: silicon, germanium, III–V compounds such as gallium arsenide, III–V ternary alloys, III–V quaternary alloys, II–VI compounds, or II–VI ternary alloys.

In a further embodiment of the inventive method, the electrical characteristics of a junction field-effect transistor (JFET) may be altered by trimming the junctions contained therein. In a still further embodiment of the present invention, a resistor, for example, a p-type resistor formed in an n-epitaxial layer which is, in turn, formed on a p-type substrate may also be trimmed in accordance with the present invention by trimming the junctions of the parasitic, vertical PNP structure so formed.

BRIEF DESCRIPTION OF THE DRAWING

A complete understanding of the present invention may be gained by considering the following detailed description in conjunction with the accompanying drawing, in which.

To facilitate understanding, identical reference numerals are used to designate elements common to the figures.

DETAILED DESCRIPTION

Figure 1:
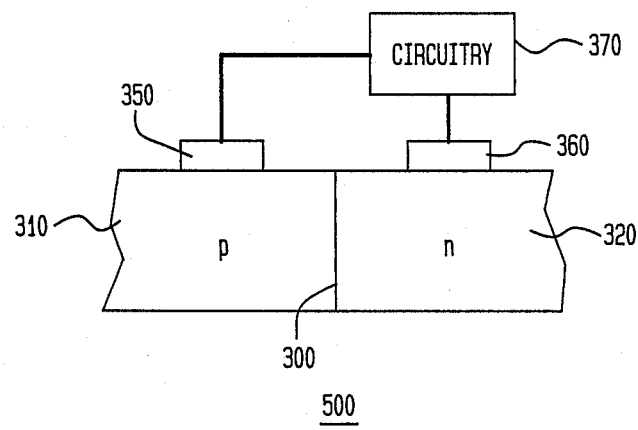
FIG. 1 shows, pictorial form, a p-n junction contained in a portion of a circuit.

FIG. 1 shows, in pictorial form, p-n junction 300 which is embedded in structure 500. Structure 500 may be a portion of a circuit and comprises p-type semiconductor 310 which is formed from, for example, silicon doped with boron and n-type semiconductor 320 which is formed from, for example, silicon doped with phosphorus. Electrode or terminal 350 is contacted to semiconductor 310 and is formed from, for example, aluminum. Electrode or terminal 360 is contacted to semiconductor 320 and is formed from, for example, aluminum. Although electrodes 350 and 360 are shown in FIG. 1 to be formed from a single material, i.e., aluminum, it is within the spirit of the present invention for electrodes 350 and 360 to be formed from structures comprising several materials and layers of materials, some of which materials do not necessarily have to be metals.

In accordance with a first embodiment of the inventive method, a reverse bias voltage pulse generated in circuit 370 is applied to terminals 350 and 360 and thereby, in turn, across p-n junction 300. In accordance with the present understanding of the inventive method, the temperature within semiconductors 310 and 320 rises in response to the application of the pulse to terminals 350 and 360. As a result, aluminum diffuses from terminals 350 and/or 360 into the silicon of semiconductors 310 and 320. Although the temperature of semiconductors 310 and 320 increases due to current flow between terminals 350 and 360, most of the temperature increase occurs across the depletion region surrounding p-n junction 300. As a result, the aluminum preferentially diffuses into the area surrounding p-n junction 300. If any of the aluminum is ionized, the electric field generated by the voltage pulse will help sweep it into p-n junction 300. Finally, due to the fact that dislocations are present in the area surrounding p-n junction 300 and the fact that p-n junction 300 is hotter than adjacent regions, the aluminum remains in the area surrounding p-n junction 300. Consequently, the electrical characteristics of p-n junction 300 will be altered. The electrical characteristics of p-n junction 300 will also be altered in view of the fact that introduction of aluminum into p-n junction 300 damages the junction. This damage occurs because aluminum atoms are different from the host silicon atoms and, hence, cause dislocations to appear in the silicon. Thus, the electrical characteristics of p-n junction 300 are altered. Specifically, the introduction of aluminum into p-n junction 300 causes the recombination velocity to increase and the saturation current to increase.

Note that as discussed above, when electrodes 350 and/or 360 are structures comprising several different materials from one or more layers, the alteration of the electrical characteristics of the junction will be affected by introducing material or materials from these structures, some of which material need not necessarily be a metal, into the vicinity of p-n junction 300.

In accordance with the present invention, the voltage pulse should not have sufficient voltage amplitude, time duration or energy to cause dendrites or filaments of aluminum to be formed in the silicon. This would occur, for example, if the energy in the pulse were sufficient to raise the temperature in semiconductor 310 and 320 above the eutectic temperature of aluminum and silicon. If this were to occur, then silicon in semiconductors 310 and 320 would migrate into the aluminum of terminal 350 and/or 360 and aluminum dendrites or filaments would be formed in semiconductor 310 and/or semiconductor 320. This is avoided in accordance with the inventive method since the pulses merely cause the electrical characteristics of p-n junction 300 to be altered without causing the formation of dendrites or filaments in the semiconductor material adjacent to the junction.

The inventive method includes the use of forward bias pulses as well as reverse bias pulses. However, in either case, in order to achieve the required alteration of the electrical characteristics of the junction in accordance with the inventive method, the pulses will typically have an amplitude of one or more of its electrical parameters, whether it be voltage or current or power and so forth, which substantially exceeds the amplitude of the normal operating condition of that electrical parameter for the junction. In addition, preferred embodiments of the inventive method use reverse bias voltage pulses which have a voltage amplitude which substantially exceeds the normal operating voltage of the junction.

It should be clear to those skilled in the art that when the inventive method is used, for example, to trim a three-terminal device such as a transistor, the breakdown voltage between any two terminals depends upon the termination of the third terminal. For example, for most practical cases, the two breakdown voltages of most interest are: (1) the emitter-base breakdown voltage with the collector open and (2) the collector-base breakdown voltage with the emitter open. Emitter-base breakdown voltage with open-circuit collector is primarily determined by the nature of the emitter-base p-n junction. Most silicon diffused transistors used in integrated circuits have emitter-base breakdown voltages in the range between 6 and 8 volts. Collector-base breakdown voltage for open-circuit emitter is determined primarily by the geometry of the collector-base junction and the doping concentration in the base and is often as high as 190 volts.

In principal, the pulses used in embodiments of the inventive method which reverse bias the junction could take the form of, for example, constant current pulses, constant voltage pulses or constant energy pulses. These types of pulses are described because they present a relatively straightforward application for the inventive method. Nevertheless, it should be clear to those skilled in the art that other and more complex types of pulses may be used when practicing the inventive method.

In practice a constant current pulse and a constant voltage pulse are hard to control in the reverse bias case because no current flows until breakdown occurs. For this reason, when utilizing reverse bias pulses, it is preferred to utilize a constant energy pulse. It should be clear to those skilled in the art that such a pulse may be generated by discharging a capacitor through a resistor. In this case, the time constant of the pulse is determined to be the product of the resistance and the capacitance. For example, discharging a 0.1 uf capacitor through a 1.6K resistor gives a 160 usec time constant. Further whenever such a capacitor is charged with a voltage of 350 volts, the energy of the resulting pulse will be $CV^2/2$, or 6.125 millijoules.

Figure 2:
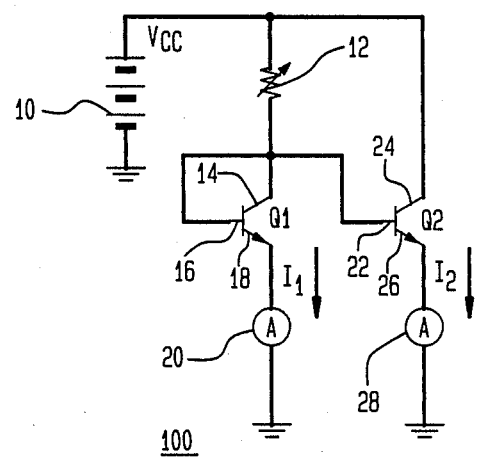
FIG. 2 shows a current mirror.

FIG. 2 shows bipolar current mirror 100 which will be used to illustrate the principles of the inventive method. In particular, FIG. 2 will be used to illustrate how an electrical parameter of a circuit may be affected by altering the electrical characteristics of a junction contained therein. As shown in FIG. 2, $V_{CC}$ power supply 10 comprises the power supply for current mirror 100, a typical valve of $V_{CC}$ being 5 volts DC. Collector electrode 14 of NPN transistor Q1 is connected through 5K ohm potentiometer 12 to $V_{CC}$ power supply 10 and its base electrode 16 is also so connected. Emitter electrode 18 of transistor Q1 is connected to ground through current measuring meter 20. Current leg transistor Q2 has its base electrode 22 connected in common with base electrode 16 of transistor Q1, its collector electrode 24 connected to $V_{CC}$ power supply 10, and its emitter electrode 26 connected to ground through current measuring meter 28. If the two transistors are originally identical, as may be expected if they are chosen of the same type, such as discrete 2N4401 transistors or corresponding transistors of an MC 3346 chip, and if $V_{BE}$ is the same for both transistors, as provided by hard wiring in this case, then $I_1=I_2$ as measured by meters 20 and 28. For an MC 3346 chip, and with $V_{CC}$ equal to 5 volts DC, $I_1$ and $I_2$ were measured to be equal to 4 mA in each case. After subjecting the emitter-base junction of transistor Q2 to a reverse bias with a pulse train of less than 1 second in total duration, each pulse having a peak voltage of about 1000 volts—this voltage being sufficient to overcome the measured breakdown voltage of the emitter-base junction of transistor Q2—and a 50% duty cycle with a pulse width of about 40 microseconds, $I_1$ remained at 4 mA whereas $I_2$ was measured as 2.5 mA. Circuit 100 continued to perform as a current mirror after Q2 was altered, as verified by changing the setting of potentiometer 12 and/or the value of $V_{CC}$, both of which changes caused corresponding changes in $I_1$ and $I_2$ by a constant ratio.

Although the above-described example is directed to bipolar transistors and, in particular, to alteration of an MC 3346 IC chip, the technique will be recognized by those skilled in the art as applicable to other and different integrated circuits as well as to discrete components. For example, the inventive method may be used to trim the input offset voltage of operational amplifiers, an important parameter for this type of circuitry.

Figure 3:
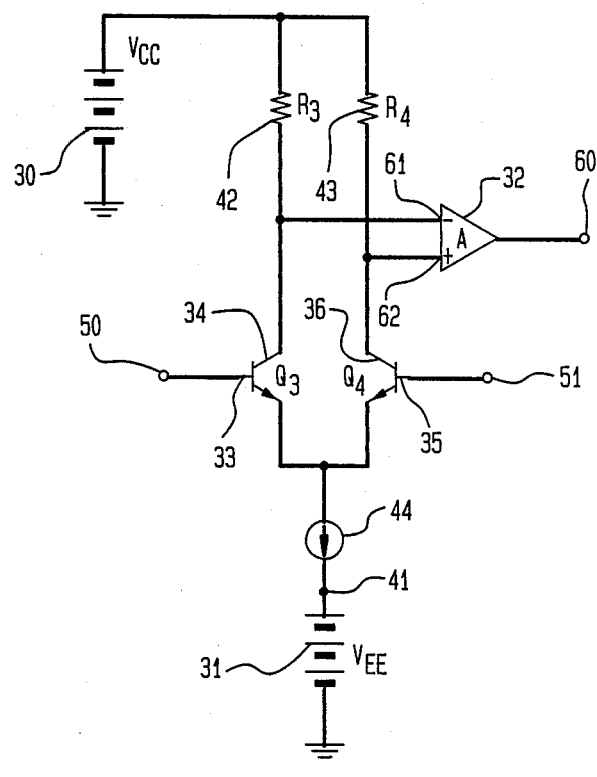
FIG. 3 shows a differential amplifier.

FIG. 3 shows differential amplifier 150. This, and similar, circuitry are important elements of operational amplifiers and the configuration shown in FIG. 3 will be used to illustrate further the principles of the inventive method. As shown in FIG. 3, $V_{CC}$ power supply 30 comprises the positive power supply for differential amplifier 150, a typical value of $V_{CC}$ being 15 volts DC. Similarly, $V_{EE}$ power supply 31 comprises the negative power supply and $V_{EE}$ typically has a value which places node 41 at $-15$ volts DC. One function of these power supplies is to bias transistors Q3 and Q4 in conjunction with resistors 42 and 43 and current source 44. In use, one input signal is applied to node 50 of differential amplifier 150 and another input signal is applied to node 51. An amplification of the input signal at node 50 appears at collector electrode 34 where it is applied, in turn, as input into inverting input terminal 61 of gain block 32. Similarly, an amplification of the input signal at node 51 appears at collector electrode 36 where it is applied, in turn, as input into non-inverting input terminal 62 of gain block 32. Subsequently, gain block 32 amplifies the difference between the signal applied as input at non-inverting input 62 and the signal applied as input at inverting input terminal 61 and delivers this amplified difference as output to node 60.

In an ideal case where transistors Q3 and Q4 are identically matched and therefore perform identically, whenever identical input signals are applied to nodes 50 and 51, respectively, the output signal at node 60 is zero. Similarly, in an ideal case where transistors Q3 and Q4 perform identically and nodes 50 and 51 are connected together, the output signal at node 60 will be zero. However, in practice, transistors Q3 and Q4 do not perform identically because they are not identically matched. Hence, some non-zero signal appears at output 60 even when inputs 50 and 51 are electrically driven in an identical manner. It is conventional terminology in the art to refer to the differential voltage which could be applied between inputs 50 and 52 to drive output 60 to zero as the input offset voltage.

It is apparent that a positive signal occurring at output node 60 whenever inputs 50 and 51 are connected together can be a consequence of transistor Q4 having a higher gain than transistor Q3. Similarly, a negative signal at output node 60 whenever inputs 50 and 51 are connected together can be a consequence of transistor Q3 having a higher gain than transistor Q4.

If transistor Q3 has a higher gain than transistor Q4, this can be remedied in accordance with the inventive method by altering the electrical characteristics of a junction by, for example, subjecting the collector-base junction of Q3 to a reverse bias voltage having an amplitude at least equal to the breakdown voltage of this junction for a time sufficient to alter the electrical gain of Q3 without destroying its intended use. Such a voltage would be applied across collector electrode 34 and node 50, respectively. As a consequence of the above, and in accordance with the inventive method, the input offset voltage of differential amplifier 150 has been altered. Similarly, the input offset voltage of differential amplifier 150 can be altered in accordance with the present invention by altering the electrical characteristics of a junction by, for example, subjecting the collector-base junction of Q4 to a reverse bias voltage pulse applied across collector electrode 36 and node 51. As a consequence of the above, and in accordance with the inventive method, the input offset voltage of differential amplifier 150 has been altered.

In practice, an LM 307 operational amplifier might typically have an input offset voltage of $+3$ millivolts. The gain ratio of the differential input of an LM 307 has been altered or trimmed in accordance with an embodiment of the inventive method. This embodiment comprised the application of a single reverse bias voltage pulse having 7 millijoules of energy and an RC time constant of 160 microseconds between collector electrode 36 of transistor Q4 and node 51. As a result, the input offset voltage of the LM 307 has been adjusted to a final value of less than $+1$ microvolt.

Although the second example discussed above is directed to a bipolar differential amplifier and, in particular, to the alteration of an LM 307 semiconductor chip, those skilled in the art will readily recognize that the inventive method is applicable to other different integrated circuits as well as to discrete components. In addition, the inventive method is also applicable to various semiconductor devices and integrated circuits such as those conventionally provided by the silicon industry and to those devices comprised of other semiconductor materials such as germanium, III-V compounds such as gallium arsenide, III-V ternary alloys, III-V quaternary alloys, II-VI compounds, or II-VI ternary alloys.

To illustrate an alternative embodiment of the inventive method wherein an alteration pulse and/or pulses is applied in the forward bias direction, reference is again made to FIG. 3 and the LM 307 operational amplifier device illustrated therein. In a first such device, an input offset voltage of +1.22 mV was measured at output 60. As described above, this indicated that the gain of transistor Q4 was greater than the gain of transistor Q3. Subsequently, the input offset voltage of the operational amplifier was increased in accordance with an embodiment of the inventive method to a first value of +1.48 mV by applying a single forward bias alteration pulse across collector electrode 34 of transistor Q3 and node 50, thereby decreasing the gain of transistor Q3. In this embodiment the alteration pulse had an amplitude of 500 volts, a time duration of about 160 microseconds, and an energy of approximately 12.5 millijoules. A second forward bias alteration pulse, identical to the first pulse, applied across these terminals further increased the input offset voltage to a value of +28.49 mV.

In a second LM 307 chip, this chip having a measured offset voltage of −0.40 mV, the aforesaid forward bias alteration pulse of 500 volts and about 160 microseconds duration was applied across collector electrode 36 of transistor Q4 and node 51. This resulted in an input offset voltage of −0.54 mV. A second forward bias alteration pulse, identical to the first, applied across these terminals further modified the input offset voltage to a value of −0.58 mV.

Figure 4:
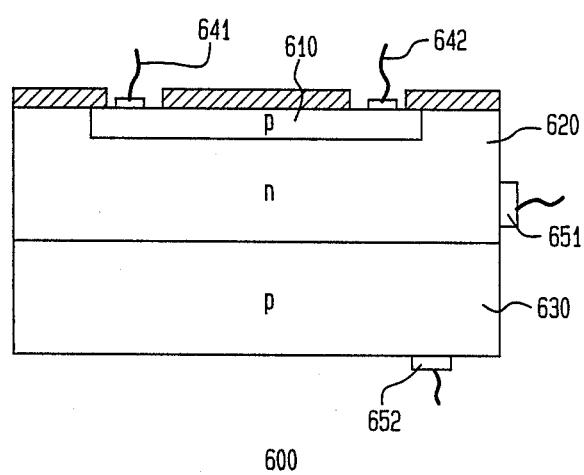
FIG. 4 shows a resistor structure which has a parasitic p-n-p structure embedded therein.

FIG. 4 shows a resistor structure 600 which has a parasitic p-n-p structure embedded therein. Resistor 610 is formed from p-type material which is embedded in n-epitaxial layer 620. N-epitaxial layer 620 is, in turn, formed on p-type substrate layer 630. As a result, a parasitc, vertical p-n-p structure is formed from elements 610, 620 and 630. Electrodes 641 and 642 are contacted to the ends of resistor 610. The value of resistance of resistor 610 may be altered in accordance with the inventive method by affixing electrodes 651 and/or 652 to layers 620 and 630, respectively. Then, the electrical characteristics of the junction between resistor 610 and layer 620 may be altered in accordance with the above-described embodiments of the inventive method by applying pulses, for example, to electrodes 642 and 651 or to electrodes 642 and 652.

In addition the electrical parameters of JFETs may be altered by applying embodiments of the invention to various terminals of the device in order to alter the electrical characteristics of p-n junctions contained therein.

Clearly, those skilled in the art recognize that further embodiments of the present invention may be made without departing from its teachings. For example, it is within the spirit of the present invention that pulses having other and different voltages, time durations and energy levels may be used in practicing the inventive method. A necessary and sufficient condition of embodiments of the inventive method is that the amplitude of one or more of the electrical parameters and the time duration of such pulses be such as to achieve the requisite alteration without destroying the device and without forming dendrites or filaments of metal in the semiconductor.

What is claimed is:

1. A method for altering an electrical characteristic of a circuit having at least one junction formed from a first and a second semiconductor and having an electrode contacted to the first semiconductor and an electrode contacted to the second semiconductor, the method comprising the step of applying at least one electrical pulse across the junction, including applying the pulse to the electrodes, the pulse having sufficient amplitude of one or more of its electrical parameters and time duration to degrade the electrical transport characteristics of the junction, and, thereby, alter the electrical characteristic of the circuit, the amplitudes of the electrical parameters and the time duration of the at least one pulse being low enough so that dendrites or filaments of material from the electrodes are not formed in the first or second semiconductor.

2. The method of claim 1 wherein the electrodes are comprised of at least one metal.

3. The method of claim 1 wherein the at least one pulse has an amplitude of one or more of its electrical parameters which substantially exceeds the amplitude of the normal operating condition of the corresponding electrical parameters for the junction.

4. The method of claim 1 wherein the at least one pulse reverse biases the junction and has a voltage amplitude which substantially exceeds the normal operating voltage of the junction.

5. The method of claim 4 wherein the at least one pulse has a voltage amplitude which is at least equal to a reverse bias breakdown voltage of the junction.

6. The method of claim 1 wherein the at least one pulse forward biases the junction.

7. The method of claim 3 wherein the at least one pulse is a substantially constant energy pulse.

8. The method of claim 1 wherein the at least one pulse is a current pulse.

9. The method of claim 1 wherein the first and second semiconductor is silicon, germanium, III-V compounds, III-V ternary alloys, III-V quaternary alloys, II-VI compounds, and II-VI ternary alloys.

10. A method for altering an electrical characteristic of a circuit having at least one junction formed from a first and a second semiconductor and having an electrode contacted to the first semiconductor and an electrode contacted to the second semiconductor, the method comprising the steps of: (1) applying at least one electrical pulse across the junction, including applying the pulse to the electrodes, the pulse having sufficient amplitude of one or more of its electrical parameters and time duration to degrade the electrical transport characteristics of the junction, and, thereby, alter the electrical characteristic of the circuit, the amplitudes of the electrical parameters and the time duration of the at least one pulse being low enough so that dendrites or filaments of material from the electrodes are not formed in the first or second semiconductor; (2) measuring the value of the electrical characteristic of the circuit; (3) comparing the measured value with a predetermined value; and (4) repeating steps 1-3 until the difference between the measured value and the predetermined value is smaller than a predetermined amount.

11. A method for altering an electrical characteristic of a circuit having at least one junction formed from a first and a second semiconductor and having an electrode contacted to the first semiconductor and an electrode contacted to the second semiconductor, the method comprising the steps of: (1) measuring the value of the electrical characteristic of the circuit; (2) comparing the measured value with a predetermined value and terminating the method if the difference between the measured value and the predetermined value is smaller than a predetermined amount, otherwise, continuing on to step 3; (3) applying at least one electrical pulse across the junction, including applying the pulse to the electrodes, the pulse having sufficient amplitude of one or more of its electrical parameters and time duration to degrade the electrical transport characteristics of the junction, and, thereby, alter the electrical characteristic of the circuit, the amplitudes of the electrical parameters and the time duration of the at least one pulse being low enough so that dendrites or filaments of material from the electrodes are not formed in the first or second semiconductor, and (4) returning to step 1.

12. A method for matching an electrical characteristic of a circuit with that of another like circuit, each circuit having at least one junction formed from a first and a second semiconductor and having an electrode contacted to the first semiconductor and an electrode contacted to the second semiconductor, the method comprising the steps of: (1) measuring the electrical characteristic of both circuits, (2) applying at least one electrical pulse across the junction of one of the circuits, including applying the pulse to the electrodes, the pulse having sufficient amplitude of one or more of its electrical parameters and time duration to degrade the electrical transport characteristics of the junction, and, thereby, alter the electrical characteristic of the circuit, the amplitudes of the electrical parameters and the time duration of the at least one pulse being low enough so that dendrites or filaments of material from the electrodes are not formed in the first or second semiconductor, (3) measuring the electrical characteristic of the altered circuit, (4) comparing the measured values of the electrical characteristic, and (5) repeating steps 2-4 until the difference between the electrical characteristics of both circuits is smaller than a predetermined amount.

13. A method for matching an electrical characteristic of a circuit with that of another like circuit, each circuit having at least one junction formed from a first and a second semiconductor and having an electrode contacted to the first semiconductor and an electrode contacted to the second semiconductor, the method comprising the steps of: (1) applying at least one electrical pulse across the junction of one of the circuits, including applying the pulse to the electrodes, the pulse having sufficient amplitude of one or more of its electrical parameters and time duration to degrade the electrical transport characteristics of the junction, and, thereby, alter the electrical characteristic of the circuit, the amplitudes of the electrical parameters and the time duration of the at least one pulse being low enough so that dendrites or filaments of material from the electrodes are not formed in the first or second semiconductor, (2) measuring the electrical characteristic of both circuits, (3) comparing the measured values of the electrical characteristic, and (4) repeating steps 1-3, where step 2 hereafter only requires measurement of the electric characteristic of the circuit which is being altered, until the difference between the electrical characteristic of both circuits is smaller than a predetermined amount.

* * * * *